(12) United States Patent
Qin et al.

(10) Patent No.: US 11,257,879 B2
(45) Date of Patent: Feb. 22, 2022

(54) DISPLAY PANELS AND DISPLAY DEVICES THEREOF

(71) Applicant: Kunshan Go-Visionox Opto-Electronics Co., Ltd., Kunshan (CN)

(72) Inventors: Xu Qin, Kunshan (CN); Xiuqi Huang, Kunshan (CN); Jinfang Zhang, Kunshan (CN); Lu Zhang, Kunshan (CN); Siming Hu, Kunshan (CN); Zhenzhen Han, Kunshan (CN)

(73) Assignee: KUNSHAN GO-VISIONOX OPTO-ELECTRONICS CO., LTD., Kunshan (CN)

( * ) Notice: Subject to any disclaimer, the term of this patent is extended or adjusted under 35 U.S.C. 154(b) by 342 days.

(21) Appl. No.: 16/441,038

(22) Filed: Jun. 14, 2019

(65) Prior Publication Data

US 2019/0296094 A1  Sep. 26, 2019

Related U.S. Application Data

(63) Continuation of application No. PCT/CN2018/110689, filed on Oct. 17, 2018.

(30) Foreign Application Priority Data

May 14, 2018  (CN) .......................... 201810458283.2

(51) Int. Cl.
*H01L 27/32* (2006.01)
*H01L 51/00* (2006.01)
*G09G 3/3208* (2016.01)

(52) U.S. Cl.
CPC ....... *H01L 27/3244* (2013.01); *G09G 3/3208* (2013.01); *H01L 27/3281* (2013.01); *H01L 51/0096* (2013.01)

(58) Field of Classification Search
CPC ............. H01L 27/3244; H01L 27/3276; H01L 27/3288; G09G 3/30–3291
See application file for complete search history.

(56) References Cited

U.S. PATENT DOCUMENTS 9,985,085 B2  5/2018  Yang et al.
2005/0285542 A1 *  12/2005  Wakabayashi ...... H01L 27/3276
                                                          315/169.3
(Continued)

FOREIGN PATENT DOCUMENTS

CN  102956180 A  *  3/2013  ........... G09G 3/2092
CN  104052838 A     9/2014
(Continued)

OTHER PUBLICATIONS

CN First Office Action dated Mar. 8, 2019 in the corresponding CN application (application No. 201810458283.2).

*Primary Examiner* — Mariceli Santiago
(74) *Attorney, Agent, or Firm* — Kilpatrick Townsend & Stockton

(57) ABSTRACT

The present application relates to a display panel and a display device thereof. The display panel includes a base substrate and a number of display units disposed on the base substrate. The number of display units form a display region. A display region driving circuit is disposed on the display region of the base substrate and electrically connected to the number of display units so as to drive the number of display units. And a peripheral circuit is disposed on the base substrate at a periphery of the display region. The peripheral circuit includes a number of peripheral circuit units arranged side by side in a same direction. And the number of peripheral circuit units and the number of display units are respectively arranged correspondingly.

15 Claims, 3 Drawing Sheets

(56) References Cited

U.S. PATENT DOCUMENTS

| | | | |
|---|---|---|---|
| 2010/0053131 A1* | 3/2010 | Handa | G09G 3/30 |
| | | | 345/206 |
| 2014/0146257 A1* | 5/2014 | Fujikawa | G02F 1/136286 |
| | | | 349/42 |
| 2014/0267990 A1 | 9/2014 | Moon et al. | |
| 2017/0287394 A1* | 10/2017 | Kim | G09G 3/3266 |
| 2018/0166467 A1* | 6/2018 | Lai | H01L 27/1248 |
| 2019/0140036 A1* | 5/2019 | Hyeon | H01L 27/3276 |
| 2019/0259345 A1* | 8/2019 | Hosoyachi | G02F 1/13454 |

FOREIGN PATENT DOCUMENTS

| | | |
|---|---|---|
| CN | 104867450 A | 8/2015 |
| CN | 106653722 A | 5/2017 |
| JP | 2002162641 A | 6/2002 |

\* cited by examiner

DISPLAY PANELS AND DISPLAY DEVICES THEREOF

CROSS REFERENCE TO RELATED APPLICATIONS

This application is a continuation application for International Application PCT/CN2018/110689, filed on Oct. 17, 2018, which claims the priority benefit of Chinese Patent Application No. 201810458283.2, titled "DISPLAY PANELS AND DISPLAY DEVICES THEREOF" and filed on May 14, 2018. The entireties of both applications are incorporated by reference herein for all purposes.

TECHNICAL FIELD

The present application relates to display technologies, and in particular to display panels and display devices thereof.

BACKGROUND

A development direction of display technologies is generally to improve user experiences, for example, to improve display characteristics such as color gamut, Pixel Per Inch (PPI), and contrast, etc. At present, with popularizations of civilian products such as mobile phones, televisions and the like, design of a frame of a display panel has been gradually raised higher requirements. An advantage of the display panel with a narrow frame is that a ratio of a display region to a non-display region is large, so that the display panel with the narrow frame appears to have a larger display area, thereby improving user experiences.

SUMMARY

According to an aspect of the present application, a display panel is provided. The display panel includes: a base substrate; a plurality of display units disposed on the base substrate and forming a display region; a display region driving circuit disposed on the display region of the base substrate and electrically connected to the plurality of display units so as to drive the plurality of display units; and a peripheral circuit disposed on the base substrate at a periphery of the display region; the peripheral circuit comprising a plurality of peripheral circuit units arranged side by side in a same direction, the plurality of peripheral circuit units and the plurality of display units being correspondingly arranged respectively; a width of the peripheral circuit being smaller than a width of the display region along an arrangement direction of the plurality of peripheral circuit units.

According to the aforementioned display panel of the present application, by arranging the peripheral circuit in a straight line direction and making the width of the peripheral circuit smaller than the width of the display region in a same direction, it is beneficial to reduce an occupied space of the peripheral circuit at a corner of the display panel, thereby optimizing the wiring design of the peripheral circuit at the corner of the display panel.

In one of the embodiments, the peripheral circuit comprises a DEMUX circuit.

In one of the embodiments, the peripheral circuit is disposed on at least one of sides of the base substrate.

In one of the embodiments, the plurality of display units are arranged side by side at equal pitches along an arrangement direction of the plurality of peripheral circuit units, a pitch between the plurality of display units being a preset pixel pitch.

In one of the embodiments, along the arrangement direction of the plurality of peripheral circuit units, the plurality of peripheral circuit units are arranged side by side at equal pitches, and a preset pitch between the plurality of peripheral circuit units is smaller than the preset pixel pitch.

In one of the embodiments, each of the sides of the base substrate respectively include an edge region and a middle region, the edge region includes a first edge region and a second region located on two sides of the middle region respectively; and the first edge region and the second edge region are circular-arc structures.

In an embodiment, along the arrangement direction of the plurality of peripheral circuit units, the plurality of peripheral circuit units corresponding to the middle region are arranged side by side at equal pitches; and a preset pixel pitch between the plurality of display units corresponding to the middle region is equal to the preset pitch.

In one of the embodiments, a pitch between peripheral circuit units corresponding to the first edge region and a pitch between peripheral circuit units corresponding to the second edge region are both smaller than a preset pitch between peripheral circuit units corresponding to the middle region.

In an embodiment, a preset pitch between peripheral circuit units corresponding to the first edge region gradually decreases in a linear direction from the middle region to the first edge region, and a preset pitch between peripheral circuit units corresponding to the second edge region gradually decreases in a linear direction from the middle region to the second edge region.

In an embodiment, along the arrangement direction of the plurality of peripheral circuit units, the peripheral circuit units corresponding to the first edge region and the second edge region are arranged side by side at equal pitches, respectively.

In one of the embodiments, along the arrangement direction of the plurality of peripheral circuit units, the plurality of peripheral circuit units corresponding to the middle region are arranged side by side at equal pitches; and a preset pitch between the plurality of peripheral circuit units corresponding to the middle region is smaller than the preset pixel pitch.

In one of the embodiments, a pitch between peripheral circuit units corresponding to the first edge region and a preset pitch between the peripheral circuit units corresponding to the second edge region are both smaller than the preset pitch between the peripheral circuit units corresponding to the middle region.

In one of the embodiments, a preset pitch between peripheral circuit units corresponding to the first edge region gradually decreases in a linear direction from the middle region to the first edge region, and a preset pitch between peripheral circuit units corresponding to the second edge region gradually decreases in a linear direction from the middle region to the second edge region.

In one of the embodiments, along the arrangement direction of the plurality of peripheral circuit units, the peripheral circuit units corresponding to the first edge region and the second edge region are arranged side by side at equal pitches, respectively.

In one of the embodiments, the peripheral circuit includes a combination of one or more of a scan drive circuit, an electrostatic discharge circuit, and a test circuit.

In one of the embodiments, the base substrate is a glass substrate or a flexible material substrate.

According to another aspect of the present application, a display device including the display panel of any of the above embodiments is further provided.

DETAILED DESCRIPTION OF THE EMBODIMENTS

With a popularity of narrow frame products with four-corner arc on the market, a user's demand for the narrow frame is increasing, and a design specification of the frame of a screen is continuously reducing correspondingly. For a bottom frame radius specification proposed by mobile phone manufacturers, a conventionally designed display panel cannot meet requirements of a manufacturing process.

In order to meet a narrow frame design at a bottom of the display panel, manufacturers usually designs a peripheral circuit under the display panel. However, the peripheral circuit corresponding to a pixel unit in an arc region of the narrow frame with four-corner arc will increase a difficulty of wiring in the arc region and affect the wiring design of the arc region.

The above objects, features and advantages of the present application will become more apparent by describing in detail embodiments thereof with reference to the accompanying drawings. Specific details are set forth in the following description in order to facilitate a thorough understanding of the present application. It should be understood by those skilled in the art that a plurality of modification and improvement may be made therein without departing from the spirit of the present application. Therefore, the application is not limited by the specific embodiments disclosed below.

Figure 1:
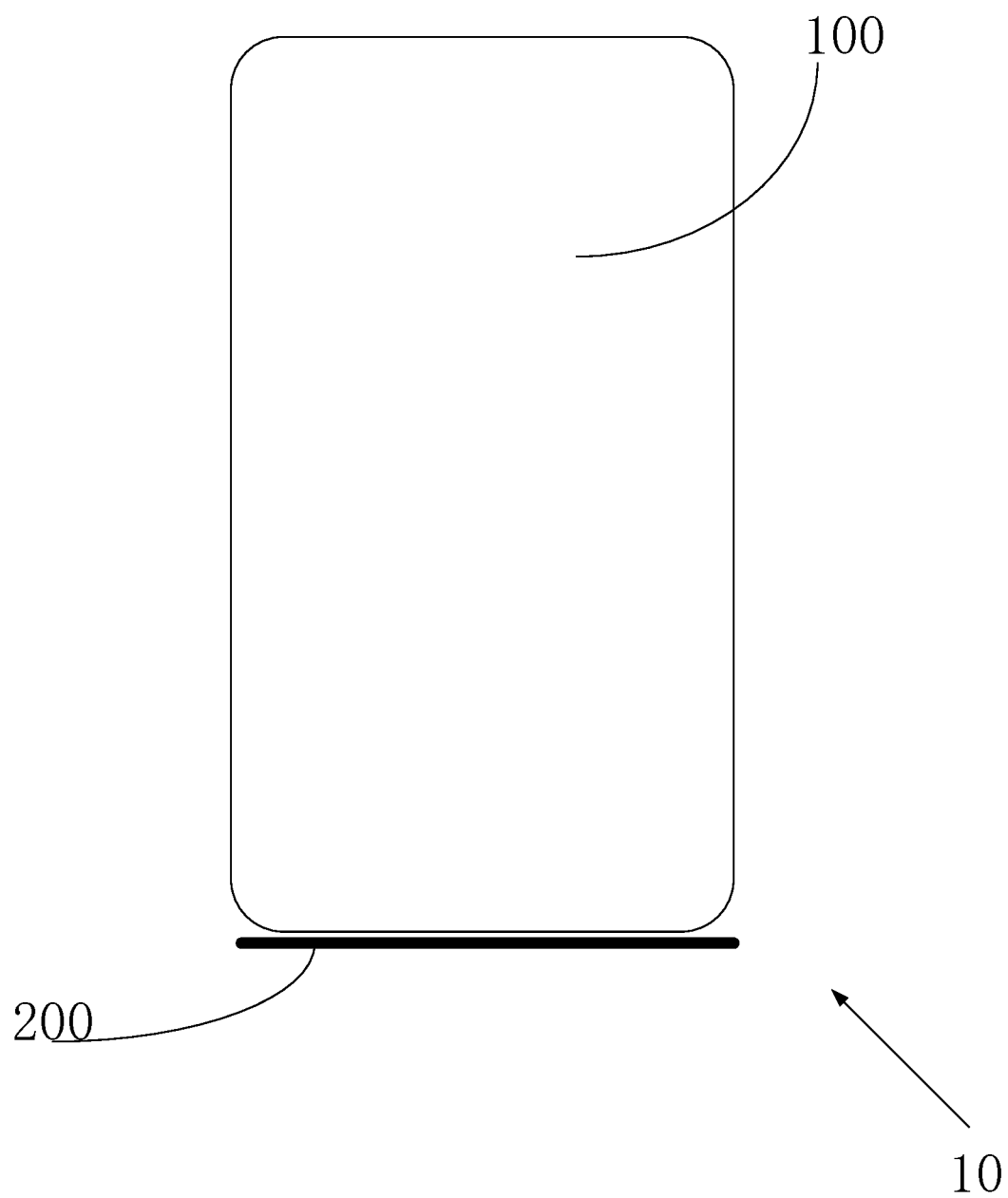
FIG. 1 is a planar view of a display panel according to an exemplary embodiment of the present application.
Figure 2:
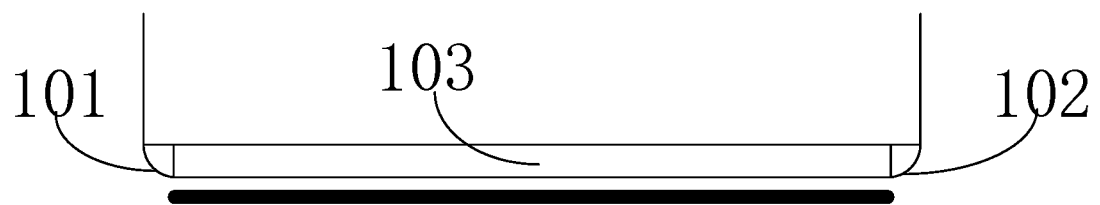
FIG. 2 is a partial view of a display panel according to an exemplary embodiment of the present application.

Referring to FIG. 1 and FIG. 2, the present application provides a display panel 10. The display panel 10 includes a base substrate, a display region 100 disposed on the base substrate, a display region driving circuit, and a peripheral circuit 200. The display region 100 includes a plurality of display units 1001 for displaying screen images. The display region driving circuit is electrically connected to the display units 1001 of the display region 100 to drive the display units 1001. The peripheral circuit 200 may include circuits for scan driving, data driving, or electrostatic discharge, etc., disposed on the base substrate and on a side of the display region 100.

In the display region 100, these display units 1001 are arranged in an array, and are generally arranged side by side in a row direction and a column direction of the display region 100. The peripheral circuit 200 includes a plurality of peripheral circuit units 2001 arranged side by side in a same (straight) direction (for example, the aforementioned row direction or column direction). Each peripheral circuit unit 2001 corresponds to a corresponding display unit 1001 for performing data driving and/or scan driving or the like to the corresponding display unit 1001. Further, a width of the peripheral circuit 200 is smaller than a width of the display region 100 along an arrangement direction of the peripheral circuit unit, for example, the aforementioned row direction (or the column direction). It can be understood that the width of the peripheral circuit 200 refers to a width of a wiring region of the peripheral circuit units 2001.

The display panel of the present application facilitates reducing an occupied space of the peripheral circuit at a corner of the display panel by arranging the peripheral circuit in a linear direction and making the width of the peripheral circuit smaller than the width of the display region in the linear direction. Further, the wiring design of the peripheral circuit at the corners of the display panel is optimized.

In an exemplary embodiment, the base substrate may be a glass substrate or a flexible material substrate. A primary role of the base substrate is to provide support and protection for other functional layers on the display panel 10. The display panel 10 manufactured by using a glass substrate or a flexible material substrate as a substrate is a normal display panel or a flexible display panel.

The display unit 1001 includes a display layer and electrodes disposed on two sides of the display layer.

Further, the display unit 1001 may be an OLED (Organic Light Emitting Diode) device or an LED (Light Emitting Diode) device or the like. Taking that the display unit 1001 is the OLED device as an example, each display unit 1001 may include an organic functional layer and an anode and a cathode respectively disposed on two sides of the organic functional layer.

In an exemplary embodiment, the peripheral circuit 200 may be a DEMUX (demultiplexer) circuit. Specifically, the DEMUX circuit is a data peripheral circuit that includes a plurality of DEMUX circuit units. The DEMUX circuit unit is connected to a driving chip for distributing RGB data signals to an inside of a pixel circuit, so as to display an image.

Optionally, the peripheral circuit 200 may also be a combination of one or more of a scan driving circuit and an electrostatic discharge circuit. The scan driving circuit includes a plurality of row driving circuit units that are capable of driving pixel circuits, generating signals, controlling pixel initialization and compensation processes, and controlling pixel display time. The electrostatic discharge circuit includes a plurality of ESD (Electro-Static Discharge) circuit units for providing ESD protection to input signals of the aforementioned various circuits.

Further, the peripheral circuit 200 may also be a test circuit for testing the lighting and aging of a screen body of the display panel before bonding the driving chip.

In an exemplary embodiment, the display units 1001 of each pixel in the display panel 10 are correspondingly provided with the peripheral circuit units 2001 of the peripheral circuit 200, and it can be understood that the plurality of peripheral circuit units 2001 and the plurality of display units 1001 are respectively provided correspondingly.

In an exemplary embodiment, the peripheral circuit units 2001 are disposed on at least one of peripheral sides of the display region.

Referring to FIG. 2, in an exemplary embodiment, the display panel 10 is a narrow frame display panel 10 with four-corner arc (having an arc shape at four corners). On the basis of realizing the narrow frame and a full screen, the display screen is also in a four-corner arc structure. The peripheral sides of the display region respectively include an edge region and a middle region 103, and the edge region includes a first edge region 101 and a second edge region 102 on two sides of the middle region 103.

Further, the first edge region 101 and the second edge region 102 are both in a circular-arc structure.

Figure 3:
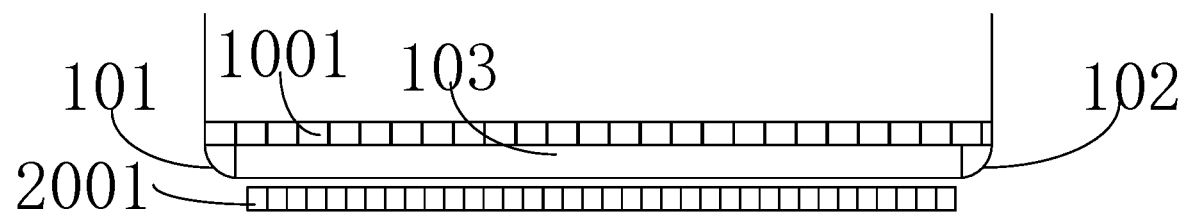
FIG. 3 is a partial view of a display panel according to a specific embodiment of the present application.

Referring to FIG. 3, in an exemplary embodiment, the plurality of peripheral circuit units 2001 are arranged side by side at equal pitches in the same linear direction (for example, the row direction or the column direction in which the display units 1001 are arranged in an array). And the aforementioned plurality of display units 1001 are also arranged side by side at equal pitches in the arrangement direction of the plurality of peripheral circuit units. Each of the display units 1001 has a fixed and identical preset pixel pitch between them, and a preset pitch between the peripheral circuit units 2001 is smaller than the preset pixel pitches between the display units 1001. Since the display units 1001 are disposed corresponding to the peripheral circuit units 2001, the width of the peripheral circuit 200 is significantly smaller than the width of the display region 100.

In a specific embodiment, in order to achieve an FHD (Full High Definition) display effect, the preset pixel pitches between the display units 1001 is set as 63. 2 µm, and the width of the display region 100 formed by the display units 1001 at a bottom side of the display region 100 is 68. 256 mm. The preset pitches between the peripheral circuit units 2001 corresponding to the plurality of display units 1001 are 55. 2 µm. It can be known that the width of the display units 1001 on the bottom side of the display region is 59. 616 mm, so that the space occupied by the peripheral circuit 200 at a bottom of the screen body is greatly reduced in width.

Figure 4:
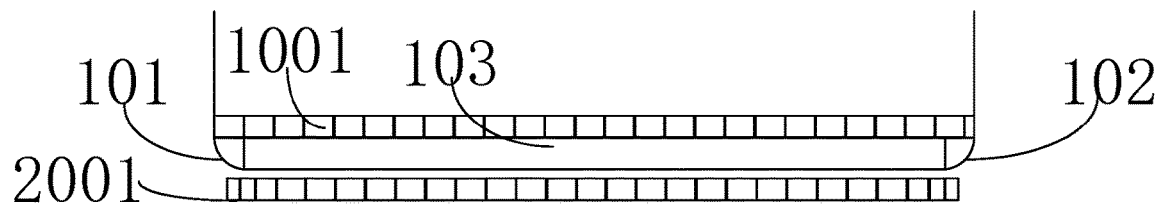
FIG. 4 is a partial view of a display panel according to a specific embodiment of the present application.
Figure 5:
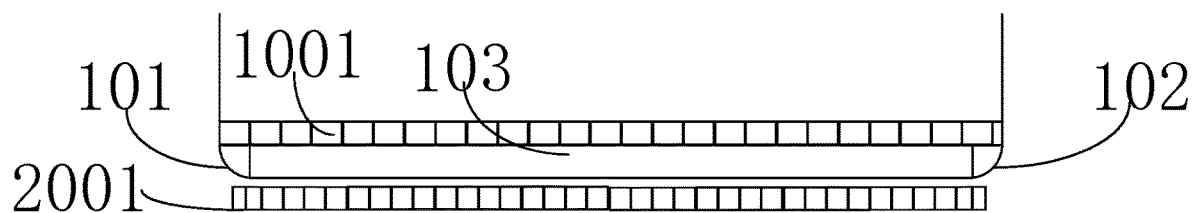
FIG. 5 is a partial view of a display panel according to a specific embodiment of the present application.

Referring to FIG. 4, in an exemplary embodiment, there is a fixed and identical preset pixel pitch between each of the display units 1001 in the same direction. The peripheral circuit 200 includes peripheral circuit units 2001 corresponding to the middle region 103 of the display region and peripheral circuit units 2001 corresponding to the first edge region 101 and the second edge region 102 of the display region. The preset pitches between the peripheral circuit units 2001 corresponding to the middle region 103 are set in correspondence with the preset pixel pitches between the display units 1001 and the pitches are the same. The preset pitches between the peripheral circuit units 2001 corresponding to the first edge region 101 and the second edge region 102 are smaller than the preset pitches between the peripheral circuit units 2001 corresponding to the middle region 103. Thus, the width of the peripheral circuit is smaller than the width of the display region in the arrangement direction of the peripheral circuit units. This arrangement reduces the space occupied by the peripheral circuit 200 at corners of the display panel 10, thereby optimizing the wiring design of the peripheral circuit 200 at the corners of the display panel 10.

Specifically, the preset pitches between the peripheral circuit units 2001 corresponding to the first edge region 101 gradually decrease in a linear direction from the middle region 103 to the first edge region 101 of the display region, and the preset pitches between the peripheral circuit units 2001 corresponding to the second edge region 102 gradually decrease in a linear direction from the middle region 103 of the display region to the second edge region 102 of the display region. This arrangement is able to reduce the space occupied by the peripheral circuit 200 at the corners of the display panel 10 without introducing redundant Fan-out lead wires to lead and package the display units 1001 and the peripheral circuit units 2001. This exemplary embodiment greatly reduces the space occupied by the peripheral circuit 200 at the bottom of the screen body in width.

In a specific embodiment, in order to achieve the FHD (Full High Definition) display effect, the preset pixel pitches between the display units 1001 are set as 63. 2 µm, and the width of the display region 100 formed by the display units 1001 at a bottom side of the display region 100 is 68. 256 mm. The preset pitches between the peripheral circuit units 2001 corresponding to the middle region 103 of the bottom side of the display region 100 are also 63. 2 µm. The preset pitches between the peripheral circuit units 2001 corresponding to the first edge region 101 of the bottom side of the display region 100 are less than 63.2 µm, and gradually decreases in a linear direction from the middle region 103 to the first edge region 101. The preset pitches between the peripheral circuit units 2001 corresponding to the second edge region 102 of the bottom side of the display region 100 are also less than 63. 2 µm, and decrease gradually in a linear direction from the middle region 103 to the second edge region 102. Thereby, the space occupied by the peripheral circuit 200 at the bottom side of the display panel 10 is reduced.

In another exemplary embodiment, in a case where the preset pitches between the peripheral circuit units 2001 corresponding to the middle region 103 are set in correspondence with the preset pixel pitches between the display units 1001 corresponding to the middle region 103 and the pitches are the same, the peripheral circuit units 2001 corresponding to the first edge region 101 and the second edge region 102 are arranged side by side at equal pitch and the preset pitches between the peripheral circuit units 2001 corresponding to the first edge region 101 and the second edge region 102 are both smaller than the preset pitches between the peripheral circuit units 2001 corresponding to the middle region 103 in the arrangement direction of the plurality of peripheral circuit units. Thereby, the width of the peripheral circuit is smaller than the width of the display region in the arrangement direction of the peripheral circuit units.

In an exemplary embodiment, in a same direction, there is a fixed and identical preset pixel pitch between each of the display units 1001; the peripheral circuit 200 includes peripheral circuit units 2001 corresponding to the middle region and peripheral circuit units 2001 corresponding to the first edge region and the second edge region. In this exemplary embodiment, the peripheral circuit units 2001 corresponding to the middle region are arranged side by side at equal pitches, and the preset pitches between the peripheral circuit units 2001 corresponding to the middle region are smaller than the preset pixel pitches between the display units 1001 corresponding to the middle region, and the preset pitches between the peripheral circuit units 2001 corresponding to the edge region are further smaller than the preset pitches between the peripheral circuit units 2001 corresponding to the middle region. This arrangement reduces the space occupied by the peripheral circuit 200 at the corners of the display panel 10, thereby optimizing the wiring design of the peripheral circuit 200 at the corners of the display panel 10.

Specifically, the preset pitches between the peripheral circuit units 2001 provided in the edge region gradually decrease in a linear direction from the middle region 103 to the edge region of the display region 100. This arrangement can reduce space occupied by the peripheral circuit 200 at the corners of the display panel 10 without introducing redundant Fan-out lead wires to lead and package the display units 1001 and the peripheral circuit units 2001. This exemplary embodiment greatly reduces the space occupied by the peripheral circuit 200 at the bottom of the screen body in width.

In another exemplary embodiment, in a case where the plurality of peripheral circuit units 2001 corresponding to the middle region 103 are arranged side by side at equal pitches, and the preset pitches between the peripheral circuit units 2001 corresponding to the middle region 103 is smaller than the preset pixel pitch between the display units 1001, the peripheral circuit units corresponding to the first edge region 101 and the second edge region 102 are arranged side by side at equal pitches, and the preset pitches between the peripheral circuit units 2001 corresponding to the first edge region and the second edge region are both smaller than the preset pitches between the peripheral circuit units 2001 corresponding to the middle region in the arrangement direction of the plurality of peripheral circuit units. Thereby, the width of the peripheral circuit is smaller than the width of the display region in the arrangement direction of the peripheral circuit units.

When the display panel 10 is in a narrow frame structure with four arc corners, by adjusting the preset pitches between the peripheral circuit units 2001 provided at the side of the base substrate, or by adjusting the preset pitches between the peripheral circuit units 2001 provided at the side arcs of the display panel 10, the space occupied by the peripheral circuit at the corners of the display panel can be reduced. This application provides two solutions for reducing the width of the peripheral circuit, one is to provide no peripheral circuit 200 in the first edge region 101 and the second edge region 102, and the other is to reduce the length of the peripheral circuit 200 corresponding to the first edge region 101 and the second edge region 102. Both of the solutions can reduce the space occupied by the peripheral circuit 200 at the arcs, thereby optimizing the wiring design of the peripheral circuit 200 at the corner of the display panel 10.

In addition, the present application further provides a display device including the display panel 10 in any of the embodiments of the present application.

Specifically, the display device may be an electronic paper, a mobile phone, a tablet computer, a television, a display, a portable computer, a digital photo frame, a navigator, or any product or component having a display function.

Since the display panel 10 of the forgoing embodiments of the present application is employed in the display device provided by the present application, the preset pitches between the peripheral circuit units 2001 corresponding to the edge region of the side are smaller than the preset pitches between the peripheral circuit units 2001 corresponding to the middle region 103 of the side. In this way, the space occupied by the peripheral circuit 200 at the corners of the display panel 10 is reduced, and the wiring design of the peripheral circuit 200 at the corners of the display panel 10 is optimized.

The technical features of the above-described embodiments can be combined arbitrarily. For the sake of brevity of description, all possible combinations of the technical features in the above embodiments are not described. However, as long as there is no contradiction between the combinations of these technical features, all the combinations should be considered as the scope of this disclosure.

The above-mentioned embodiments are merely illustrative of several embodiments of the present disclosure, and the description thereof is more specific and detailed, but is not intended to limit the scope of the present disclosure. It should be noted that a number of variations and modifications can be made by those skilled in the art without departing from the spirit and scope of the present disclosure. Therefore, the scope of the present disclosure should be determined by the appended claims.

The invention claimed is:

1. A display panel, comprising:
   a base substrate;
   a plurality of display units disposed on the base substrate and forming a display region, the plurality of display units being arranged side by side in a substantially straight direction;
   a display region driving circuit disposed on the display region of the base substrate and electrically connected to the plurality of display units so as to drive the plurality of display units; and
   a peripheral circuit disposed on the base substrate at a periphery of the display region, the peripheral circuit comprising a plurality of peripheral circuit units arranged side by side in the substantially straight direction, the plurality of peripheral circuit units and the plurality of display units being parallelly aligned;
   wherein a width of the peripheral circuit is smaller than a width of the display region along an arrangement direction of the plurality of peripheral circuit units;
   wherein peripheral sides of the display region comprises an edge region and a middle region, the edge region comprises a first edge region and a second edge region located on two sides of the middle region respectively;
   wherein a preset pitch between two adjacent peripheral circuit units corresponding to the first edge region gradually decreases in the substantially straight direction from the middle region to the first edge region, and a preset pitch between two adjacent peripheral circuit units corresponding to the second edge region gradually decreases in the substantially straight direction from the middle region to the second edge region.

2. The display panel of claim 1, wherein the peripheral circuit comprises a DEMUX circuit.

3. The display panel of claim 1, wherein
   the preset pitch between two adjacent circuit units is smaller than a preset pixel pitch between two adjacent display units.

4. The display panel of claim 1, wherein
   the first edge region and the second edge region are circular-arc structures.

5. The display panel of claim 4, wherein along the substantially straight direction, the plurality of peripheral circuit units corresponding to the middle region are arranged side by side at equal pitches, a preset pitch between two adjacent peripheral circuit units corresponding to the middle region is equal to a preset pixel pitch between two adjacent display units.

6. The display panel of claim 5, wherein the preset pitch between two adjacent peripheral circuit units corresponding to the first edge region and the preset pitch between two adjacent peripheral circuit units corresponding to the second edge region are both smaller than the preset pitch between two adjacent peripheral circuit units corresponding to the middle region.

7. The display panel of claim 4, wherein along the substantially straight direction, the plurality of peripheral circuit units corresponding to the middle region are arranged side by side at equal pitches, a preset pitch between two adjacent peripheral circuit units corresponding to the middle region is smaller than a preset pixel pitch between two adjacent display units.

8. The display panel of claim 7, wherein the preset pitch between two adjacent peripheral circuit units corresponding to the first edge region and the preset pitch between two adjacent peripheral circuit units corresponding to the second edge region are both smaller than the preset pitch between two adjacent peripheral circuit units corresponding to the middle region.

9. The display panel of claim 1, wherein the peripheral circuit comprises a combination of one or more of a scan drive circuit, an electrostatic discharge circuit, and a test circuit.

10. The display panel of claim 1, wherein the base substrate is a glass substrate or a flexible material substrate.

11. A display panel, comprising:
a base substrate;
a plurality of display units disposed on the base substrate and forming a display region, the plurality of display units being arranged side by side in a substantially straight direction;
a display region driving circuit disposed on the display region of the base substrate and electrically connected to the plurality of display units so as to drive the plurality of display units; and
a peripheral circuit disposed on the base substrate at a periphery of the display region, the peripheral circuit comprising a plurality of peripheral circuit units arranged side by side in the substantially straight direction, the plurality of peripheral circuit units and the plurality of display units being parallelly aligned;
wherein a width of the peripheral circuit is smaller than a width of the display region along an arrangement direction of the plurality of peripheral circuit units;
wherein peripheral sides of the display region comprises an edge region and a middle region, the edge region comprises a first edge region and a second edge region located on two sides of the middle region respectively;
wherein each of the plurality of peripheral circuit units corresponding to the first edge region is characterized by a first dimension along the substantially straight direction, each of the plurality of peripheral circuit units corresponding the second edge region is characterized by a second dimension along the substantially straight direction;
wherein the first dimension of each of the plurality of peripheral circuit units corresponding to the first edge region gradually decreases in the substantially straight direction from the middle region to the first edge region, and the second dimension of each of the plurality of peripheral circuit units corresponding to the second edge region gradually decreases in the substantially straight direction from the middle region to the second edge region.

12. The display panel of claim 11, wherein the peripheral circuit comprises a DEMUX circuit.

13. The display panel of claim 11, wherein the peripheral circuit comprises a combination of one or more of a scan drive circuit, an electrostatic discharge circuit, and a test circuit.

14. The display panel of claim 11, wherein the base substrate is a glass substrate or a flexible material substrate.

15. A display device, comprising the display panel according to claim 11.

* * * * *